(12) United States Patent
Dyer et al.

(10) Patent No.: US 6,518,616 B2
(45) Date of Patent: Feb. 11, 2003

(54) VERTICAL GATE TOP ENGINEERING FOR IMPROVED GC AND CB PROCESS WINDOWS

(75) Inventors: Thomas W. Dyer, Pleasant Valley, NY (US); Stephan P. Kudelka, Fishkill, NY (US); Venkatachaiam C. Jaiprakash, Beacon, NY (US); Carl J. Radens, LaGrangeville, NY (US)

(73) Assignees: International Business Machines Corporation, Armonk, NY (US); Infineon Technologies AG, Munich (DE)

(*) Notice: Subject to any disclaimer, the term of this patent is extended or adjusted under 35 U.S.C. 154(b) by 0 days.

(21) Appl. No.: 09/837,799

(22) Filed: Apr. 18, 2001

(65) Prior Publication Data

US 2002/0155654 A1 Oct. 24, 2002

(51) Int. Cl.$^7$ ............................................. H01L 27/108
(52) U.S. Cl. ........................................ 257/301; 438/206
(58) Field of Search ........................ 257/296, 301–305; 438/206, 242, 248, 282, 400, 404

(56) References Cited

U.S. PATENT DOCUMENTS

| | | | |
|---|---|---|---|
| 5,177,576 A | * | 1/1993 | Kimura et al. ............... 257/302 |
| 5,198,383 A | * | 3/1993 | Teng et al. .................. 438/242 |
| 5,914,511 A | | 6/1999 | Noble et al. |
| 5,937,296 A | * | 8/1999 | Arnold ........................ 438/243 |
| 6,027,975 A | | 2/2000 | Hergenrother et al. |
| 6,066,869 A | | 5/2000 | Noble et al. |
| 6,077,745 A | | 6/2000 | Burns, Jr. et al. |
| 6,091,119 A | | 7/2000 | Wu |
| 6,228,706 B1 | * | 5/2001 | Horak et al. ................. 257/301 |
| 6,281,539 B1 | * | 8/2001 | Mandelman et al. ....... 257/301 |
| 6,326,275 B1 | * | 12/2001 | Harrington et al. ......... 438/243 |
| 6,339,239 B1 | * | 1/2002 | Alsmeier et al. ............ 257/296 |
| 6,339,241 B1 | * | 1/2002 | Mandelman et al. ....... 257/296 |

* cited by examiner

*Primary Examiner*—David Nelms
*Assistant Examiner*—David Vu
(74) *Attorney, Agent, or Firm*—Todd M. C. Li; McGinn & Gibb, PLLC (57) ABSTRACT

A method for a memory cell has a trench capacitor and a vertical transistor adjacent to the capacitor. The vertical transistor has a gate conductor above the trench capacitor. The upper portion of the gate conductor is narrower than the lower portion of the gate conductor. The memory cell further includes spacers adjacent the upper portion of the gate conductor and a bitline contact adjacent to the gate conductor. The spacers reduce short circuits between the bitline contact and the gate conductor. The gate contact above the gate conductor has an insulator which separates the gate contact from the bitline. The difference between the width of the upper and lower portions of the gate conductor reduces short circuits between the bitline contact and the gate conductor.

5 Claims, 10 Drawing Sheets

VERTICAL GATE TOP ENGINEERING FOR IMPROVED GC AND CB PROCESS WINDOWS

BACKGROUND OF THE INVENTION

1. Field of the Invention

The present invention generally relates to integrated circuit storage devices and more particularly to an improved manufacturing method and structure that prevents unintended short circuits between gate electrodes and bitline contacts.

2. Description of the Related Art

As the technology surrounding integrated circuit storage structure progresses, there is a need to continually reduced the size of the storage structures so as to increase the density per given area of integrated circuit chip. Some conventional storage structures included a storage device such as a deep trench capacitor and an adjacent tansistor that controls access to the deep trench capacitor. However, in an effort to continue the reduction in the size of storage structures, recent trench capacitors have included vertical transistors adjacent the sides of the deep trench capacitor. Such storage devices include a gate conductor/contact in the upper portion of the deep trench. There are a number of different wiring structures and conductive connections adjacent to the storage devices, such as bitline contacts.

However, such conventional devices suffer from the disadvantage that if the gate contact or any surrounding conductive structure are not properly aligned, the misalignment may cause an unintended electrical connection between the gate contact and the adjacent structure. For example, if the gate contact is misaligned there may be an unintended short circuit between the contact bitline and the gate contact.

Therefore, there is a need for an improved manufacturing method and structure which reduces or eliminates the possibility of a short circuit between the gate contact and the bitline contact, even if slight misalignment occurs. The invention described below addresses this problem and provides a novel structure and manufacturing method that eliminates or reduces the probability of a short circuit between the gate contact and adjacent structures.

SUMMARY OF THE INVENTION

In view of the foregoing and other problems, disadvantages, and drawbacks of the conventional storage structures the present invention has been devised, and it is an object of the present invention to provide a structure and method for an improved storage structure.

In order to attain the object(s) suggested above, there is provided, according to one aspect of the invention a memory cell having a trench capacitor and a vertical transistor adjacent to the capacitor which also includes a vertical gate conductor above the trench capacitor having an upper portion with a width less than the lower portion of the gate conductor. The memory cell further includes spacers adjacent to the upper portion of the gate conductor with a bitline contact adjacent to the gate conductor. The spacers reduce short circuits between the bitline contact and the gate conductor. The gate contact above the gate conductor has an insulator which separates the gate contact from the bitline. The difference between the width of the upper and lower portions of the gate conductor reduces short circuits between the bitline contact and the gate conductor. The spacers are silicon nitride and share a border with the bitline contact.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As mentioned above, there is a need for an improved manufacturing method and structure which reduces or eliminates the possibility of a short circuit between the gate contact and the bitline contact, even if slight misalignment occurs. The invention addresses this problem and provides a novel structure and manufacturing method that eliminates or reduces the probability of a short circuit between the gate contact and adjacent structures.

Figure 1:
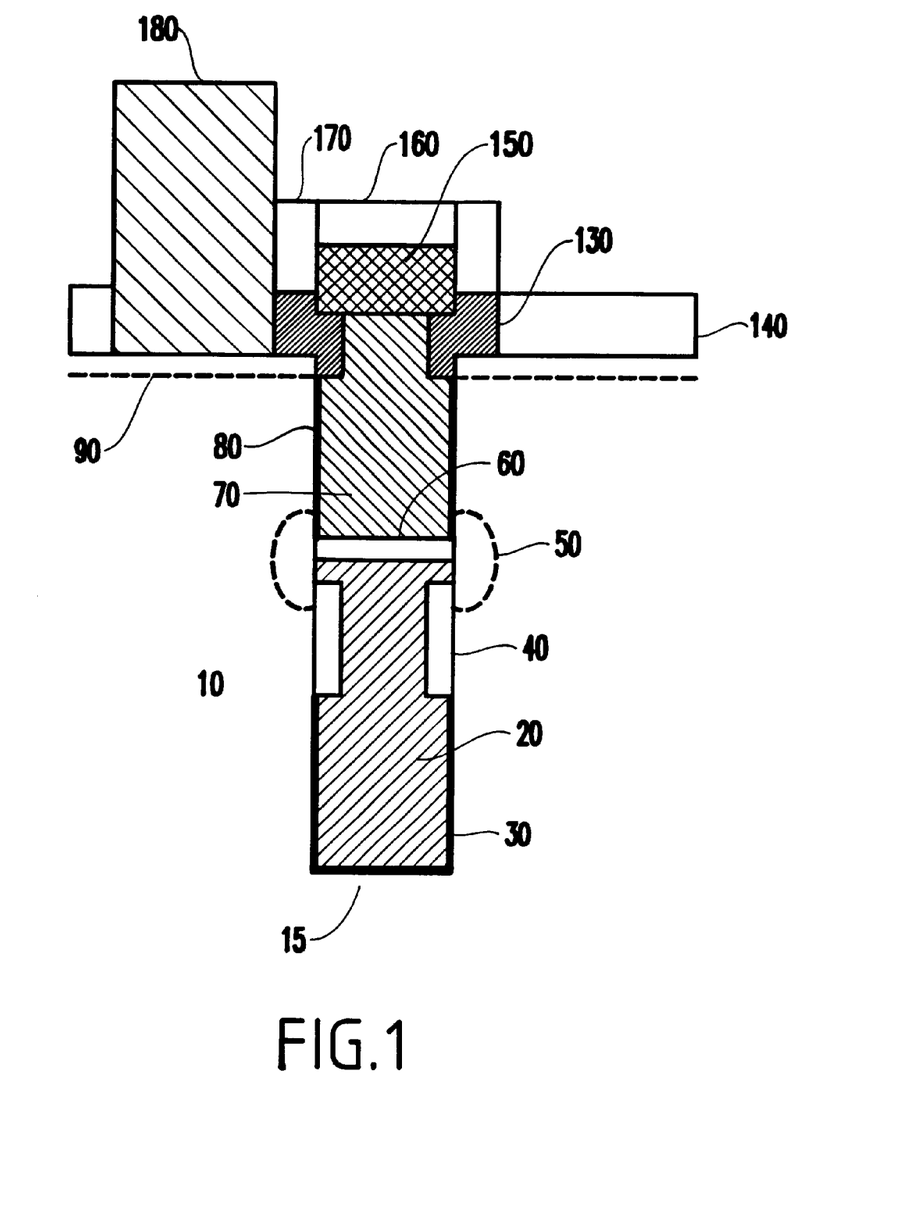
FIG. 1 is a schematic diagram of the inventive structure.

More specifically, referring to FIG. 1, a completed dynamic random access memory (DRAM) trench recess vertical gate metal oxide semiconductor field effect transistor (MOSFET) structure according to the invention is shown schematically. In FIG. 1, a deep trench 15 is formed in a silicon substrate 10. The structure also includes a node dielectric 30, a node conductor 20, a collar oxide 40, a buried strap out-diffusion 50, a trench top oxide (TTO) 60, a vertical gate conductor (vertical GC) 70, a gate oxide 80, an array junction 90, a top oxide 140, a gate conductor line (GC line) 150, a GC line cap nitride 160, a GC line spacers 170, and a borderless bitline contact (CB) 180. The invention also includes a deep trench spacer 130 which prevents the bitline contacts 180 from inadvertently shorting against the gate contact 150.

The detailed operation of the storage device shown in FIG. 1 is well known to those ordinarily skilled in the art and will not be discussed in great detail herein so as not to unnecessarily obscure the salient features of the invention. However, in operation, a signal traveling along the gate contact 150 will provide a voltage in the gate 70 which forms an electrical strap connection between the bitline contact 180 and the storage capacitor 20. The electrical strap occurs in the region around the outdiffusion area 50. In this manner, the invention allows charge to be placed and read from the deep trench capacitor 20.

The vertical GC 70 shown in FIG. 1 has been intentionally shaped to facilitate integration of the vertical trench MOSFET with the subsequent levels and to minimize the risk of it electrically shorting to the CB 180. The top part of the vertical GC 70 has a reduced diameter compared to the lower part. This reduced diameter provides a greater margin for error in alignment of the GC lines 150 without exposing the vertical gate conductor 70 to potential shorting with the CB 180.

The silicon nitride spacers 130 attached to the sides of the top part of the vertical gate conductor 70 provide further protection from shorting with the CB 180. This is because the CB etch is designed to be highly selective to silicon nitride that is widely used with borderless CB 180. This etch selectivity ensures that the GC line cap nitride 160 will serve as a barrier to protect the GC line 150 from being exposed during the CB etch.

FIGS. 2–8 show a first process sequence and FIGS. 9–17 show a second process sequence for fabricating the vertical gate structure shown in FIG. 1. In both cases the deep trench capacitor and vertical device are formed using well-known techniques that are not discussed in great detail herein, again, so as not to unnecessarily obscure the salient features of the invention. These techniques include patterning and etching the deep trenches 15, forming the collar oxide 40 and buried plate diffusion, forming the node dielectric 30 and node conductor 20, recessing the node conductor for the vertical device, forming the buried strap 50 and the trench top oxide 60, and forming the gate oxide 80 and vertical gate conductor 70. The vertical gate conductor 70 generally comprises of polysilicon and is formed by filling the trench recess after all other features have been formed. The gate polysilicon 70 is then planarized in a chemical mechanical process (CMP) down to the pad nitride 100.

Figure 2:
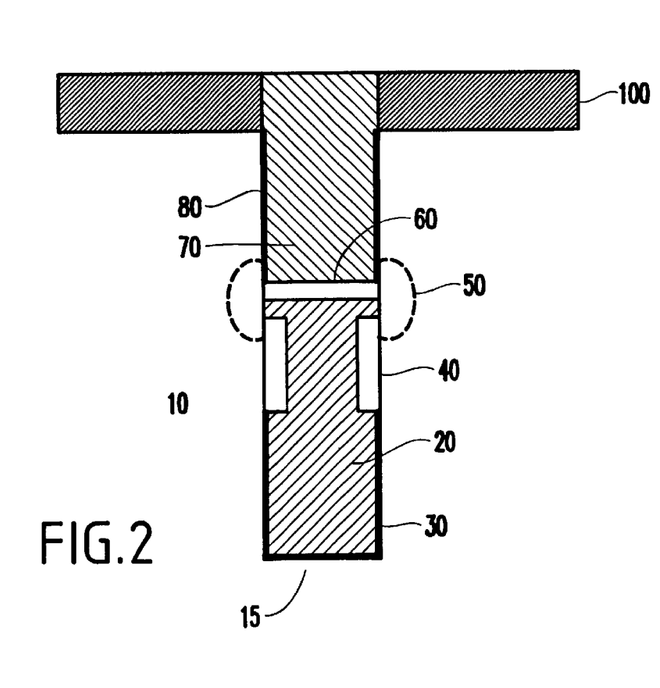
FIG. 2 is a schematic diagram of a partially completed storage structure according to the invention.
Figure 3:
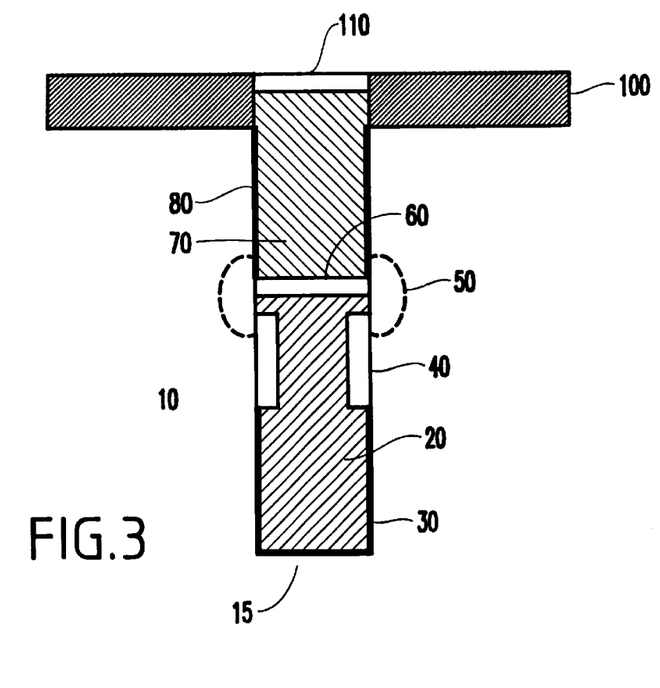
FIG. 3 is a schematic diagram of a partially completed storage structure according to the invention.

FIG. 2 depicts the point in the process after the gate polysilicon 70 has been planarized down to the pad nitride 100. Then, in FIG. 3, the top of the gate polysilicon 70 is oxidized 110 selective to the pad nitride 100, using any conventional oxidation process. This oxide is thin compared to the pad nitride (typically about 100 Å thick).

Figure 4:
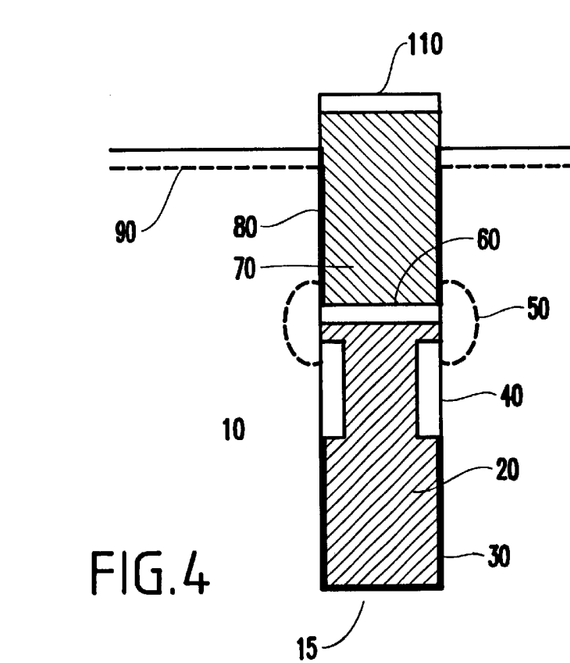
FIG. 4 is a schematic diagram of a partially completed storage structure according to the invention.

In FIG. 4, the pad nitride 100 is stripped away selective to the exposed polysilicon 70, the cap oxide 110, the pad oxide that covers the silicon surface, and the isolation oxide (not shown). More specifically, an etchant which only attacks nitride and does not attack the polysilicon 70, oxide 110, or the silicon substrate (e.g., hot phosphoric acid) is applied for a long enough time period to remove the pad nitride 100. An impurity is implanted into the silicon substrate to form the array junction 90, as shown in FIG. 4.

Figure 5:
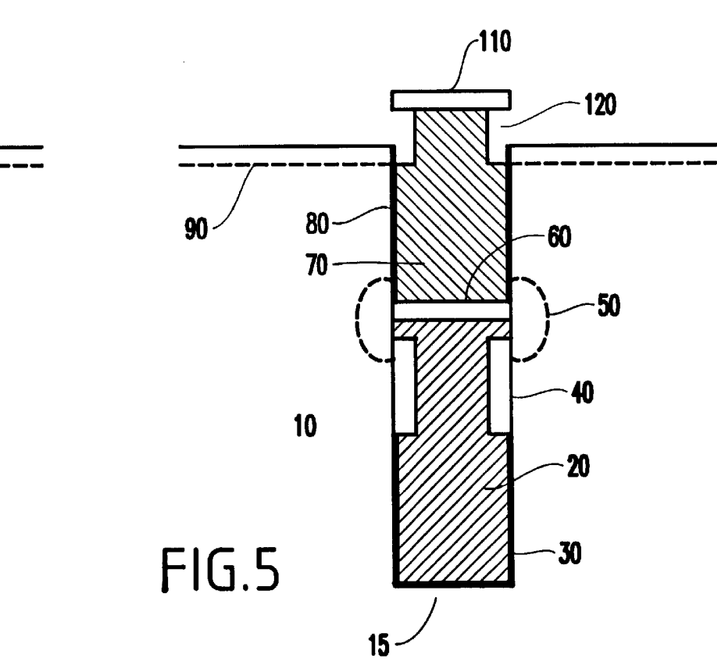
FIG. 5 is a schematic diagram of a partially completed storage structure according to the invention.

In FIG. 5, a selective etchant (e.g., ammonium hydroxide) is applied to the structure to etch the top of the gate polysilicon 70 from the sides. The etchant selectively attacks polysilicon, but does not substantially affect the oxide cap 110, the pad oxide that covers the silicon surface (not explicitly shown), or the isolation oxide 80. One quarter to one-third of the top part of the gate diameter could be removed by this etch (typically 200 Å to 500 Å). This reduction would accordingly increase the gate resistance which the design could accommodate.

Figure 6:
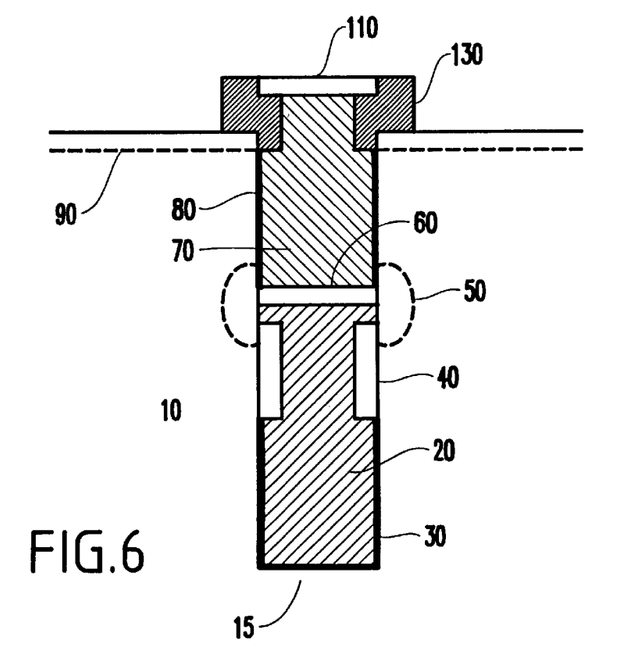
FIG. 6 is a schematic diagram of a partially completed storage structure according to the invention.

Referring now to FIG. 6, spacers 130 are formed on the top part of the gate polysilicon 70. The preferred material for these spacers 130 is silicon nitride, although any suitable insulating material may be used, depending upon the given application. The spacers 130 are formed by first depositing a conformal coating of silicon nitride and then isotropically etching the nitride from the horizontal surfaces. The isotropic etch selectively attacks horizontal surfaces at a much greater rate than it attacks vertical surfaces. Further, the chemical composition of the etch (e.g., $CH_2F_2$) principally attacks silicon nitride and does not appreciably affect the silicon substrate or the oxide 110.

Figure 7:
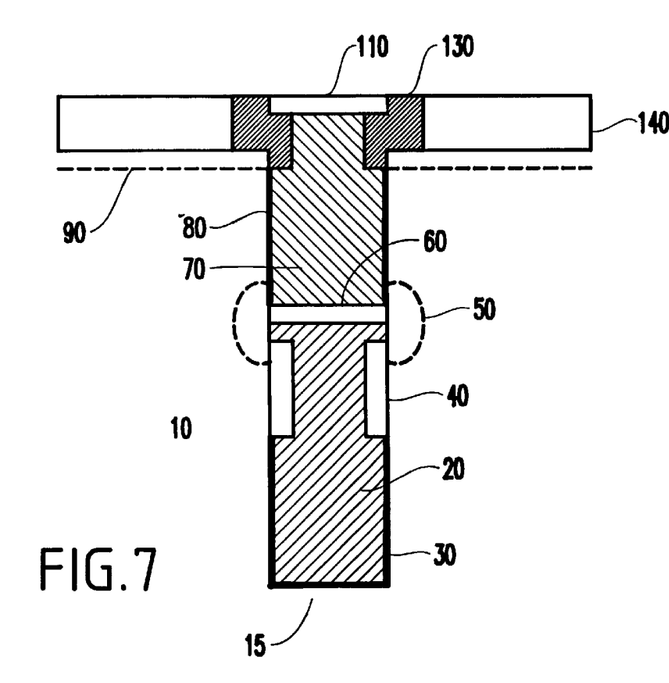
FIG. 7 is a schematic diagram of a partially completed storage structure according to the invention.

In FIG. 7 the top oxide 140 is deposited and planarized back to the top of the gate polysilicon 70 to form a highly planar surface upon which other structures/layers can be easily constructed. This planarization could be such that the top part of the gate polysilicon would be exposed, again depending upon the specific application involved.

Figure 8:
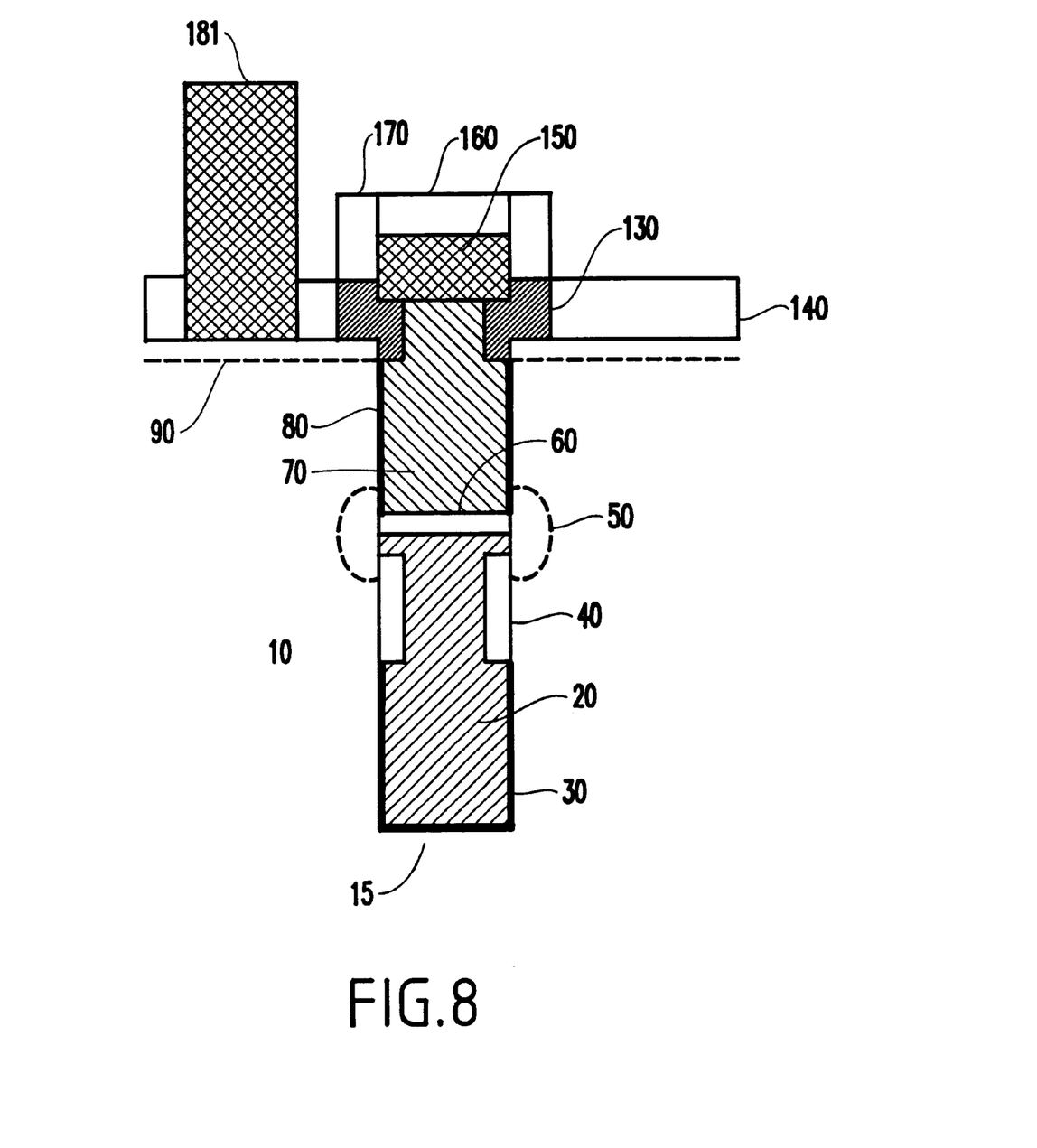
FIG. 8 is a schematic diagram of a partially completed storage structure according to the invention.
Figure 9:
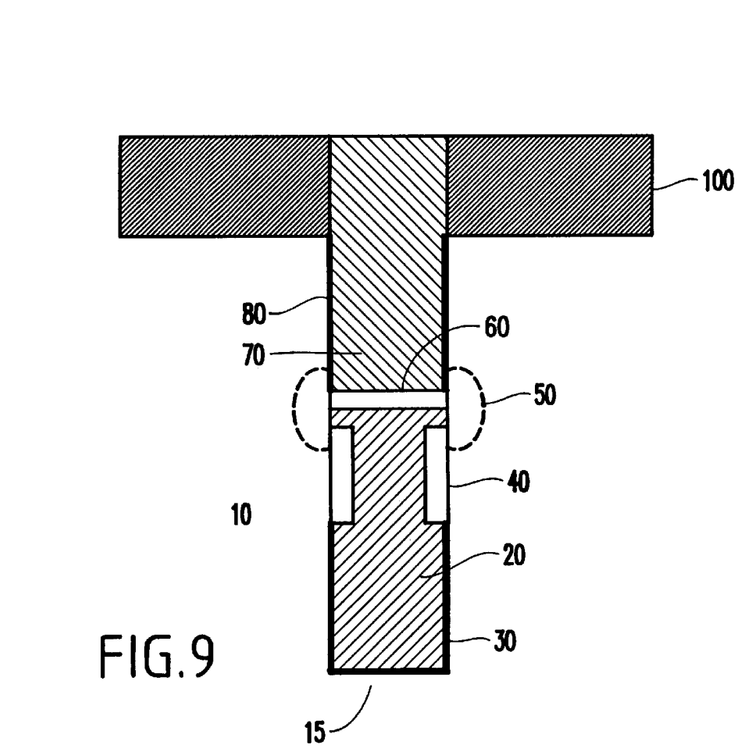
FIG. 9 is a schematic diagram of a partially completed storage structure according to the invention.

FIG. 8 shows the final structure after the GC lines 150, with their associated cap nitride 160, and spacers 170, and CBs 181 have been formed using conventional, well-known techniques. FIGS. 1 and 8 illustrate the bitline contact in two alternative forms. FIG. 1 shows the more common borderless bitline contact 180, while FIG. 8 illustrates the bitline contact 181 not sharing a border with the gate stack 150, 160, 170 (e.g., having a border separate from the gate stack 150, 160, 170). In either configuration (bordered 181 or borderless 180) the invention effectively prevents shorts from occurring between the bitline 180, 181 and the gate 70 or gate contact 150.

The inventive reduction in the top diameter of the gate polysilicon 70 (through the etching process discussed in FIG. 5) and the use of the nitride spacers 130 increases the margin for misalignment of the GC lines 150 so there is less risk of the bitline contact 180 electrically shorting with the gate conductor 70.

Referring now to FIGS. 9 through 17, an alternative process sequence for forming the gate-top structure is shown. FIG. 9 again shows the starting point where the gate polysilicon 70 has been CMP planarized down to the pad nitride 100. Here the pad nitride 100 is shown to be thicker than in FIG. 2, since this process sequence will require a thicker pad nitride. The pad nitride here may be 1.5 times as thick as that in the first sequence. In the first sequence 1200 Å would be a typical thickness while 1800 Å would be typical or the current sequence.

Figure 10:
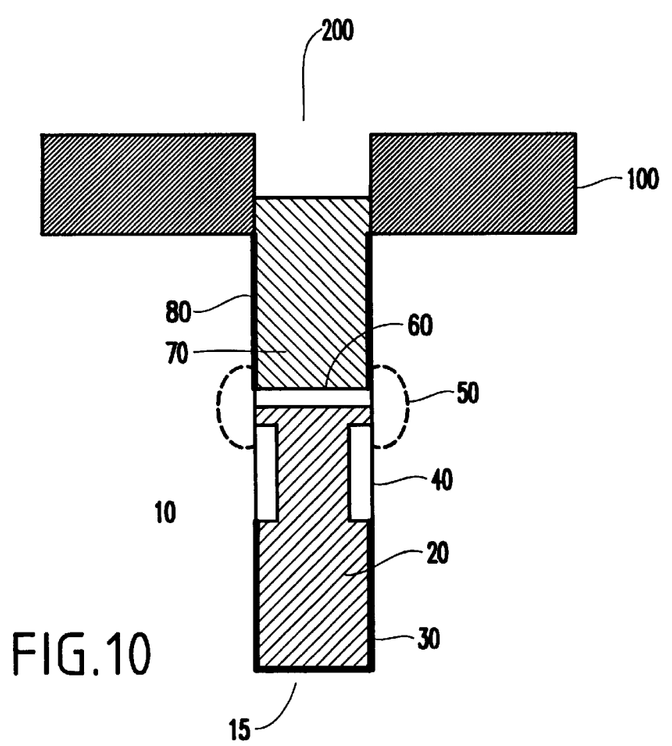
FIG. 10 is a schematic diagram of a partially completed storage structure according to the invention.
Figure 11:
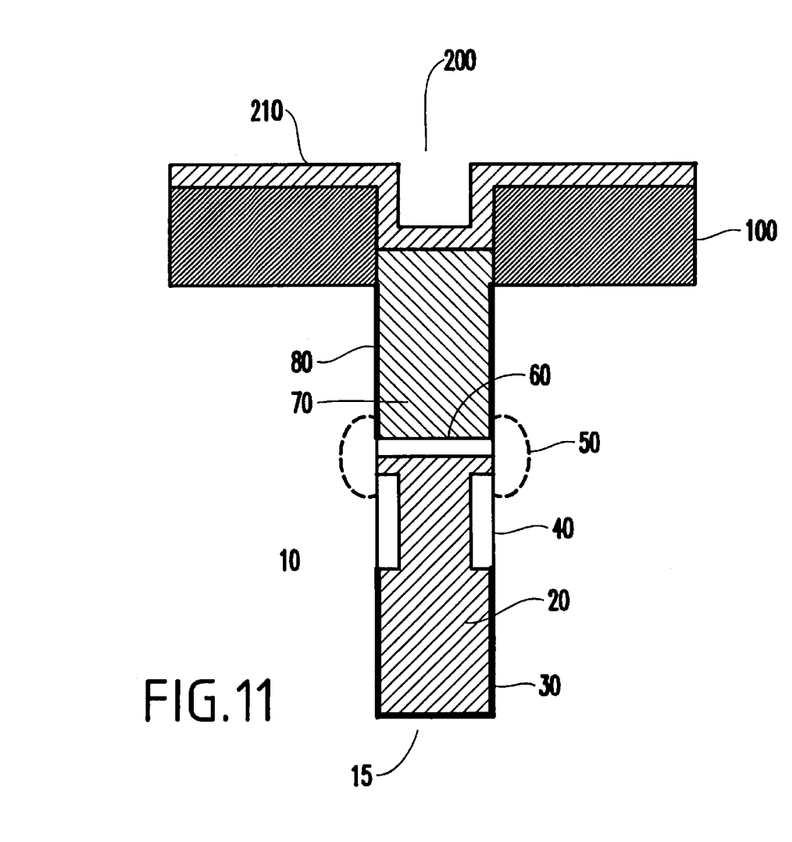
FIG. 11 is a schematic diagram of a partially completed storage structure according to the invention.

In FIG. 10, the gate polysilicon 70 is again recessed 200 to a level below the pad nitride surface, in a similar manner discussed above with respect to FIG. 3. In FIG. 11, a conformal layer of polysilicon 210 is deposited over the top surface covering the pad nitride 100 and the gate recess 200. The thickness and conformality of this polysilicon deposition 210 are selected to ensure that the recess topography is preserved. The polysilicon 210 may also help fill any open seams in the underlying gate polysilicon 70 that might otherwise complicate the processing. To ensure that the recess topography is preserved, this polysilicon layer would need to be less than about ⅓ of the recess depth. A typical thickness would be about 200 Å.

Figure 12:
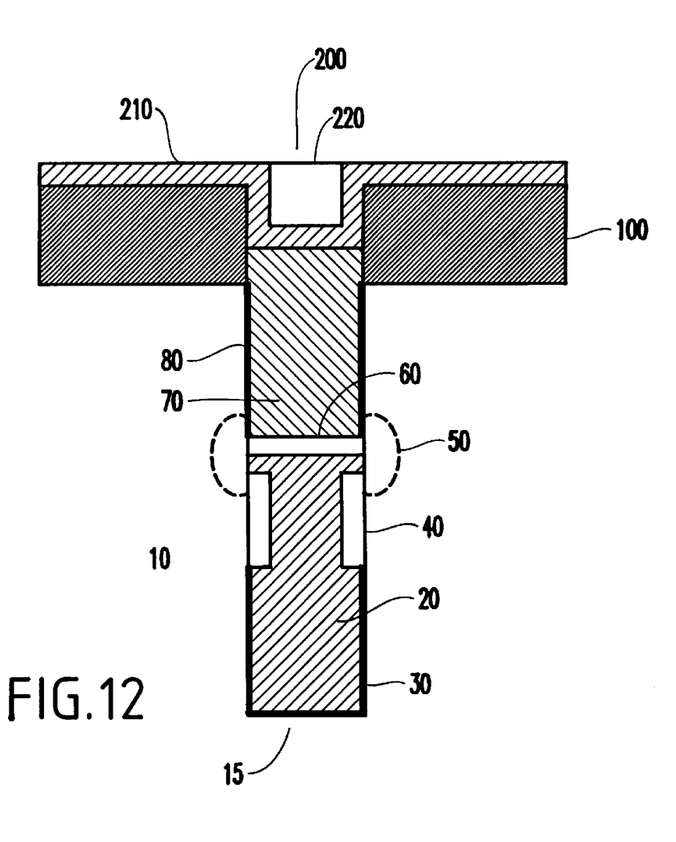
FIG. 12 is a schematic diagram of a partially completed storage structure according to the invention.

In FIG. 12, the recess 200 is filled with a plug of silicon nitride, silicon dioxide, or photoresist 220. The plug could be formed by first depositing the material over the entire surface such that it completely fills the recess and then etching back the excess material as in a divot fill process. Alternatively, the material could be deposited and then CMP planarized back to the pad nitride.

Figure 13:
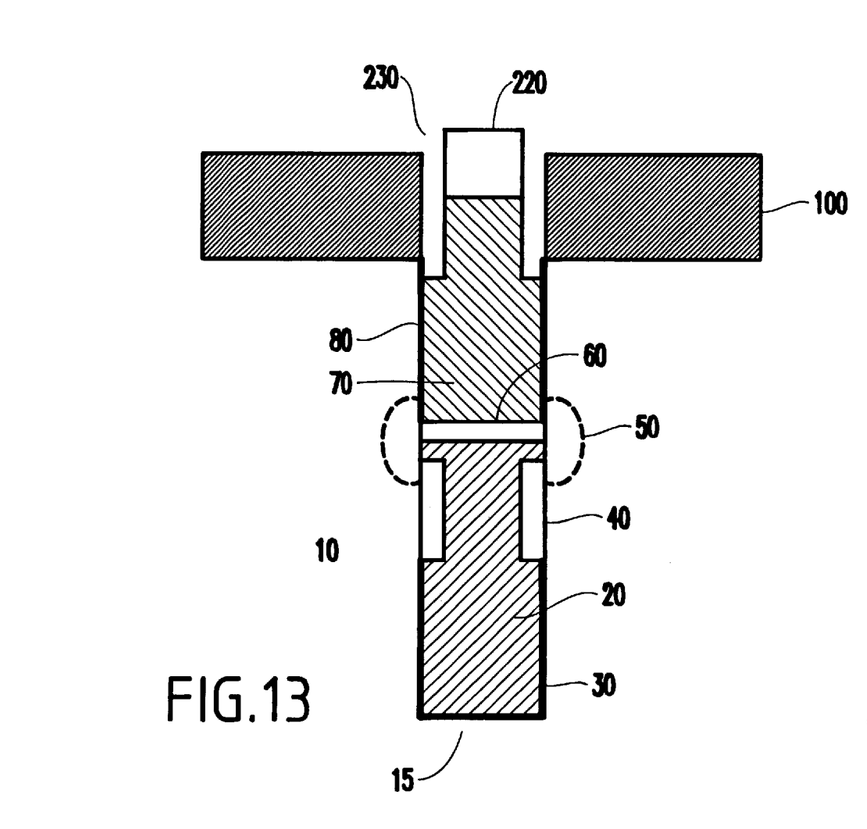
FIG. 13 is a schematic diagram of a partially completed storage structure according to the invention.

FIG. 13 illustrates the process that shapes the top of the gate 70. In a similar manner to the processing in FIG. 5, in FIG. 13 the polysilicon 210 and 70 are anisotropically etched away selective to the pad nitride 100 and the nitride, oxide, or photoresist plugs are formed 220. The depth of this polysilicon recess is highly adjustable and can be carefully controlled to meet the specific needs of the technology. Depth adjustments would be made primarily by adjusting the recess etch time.

Figure 14:
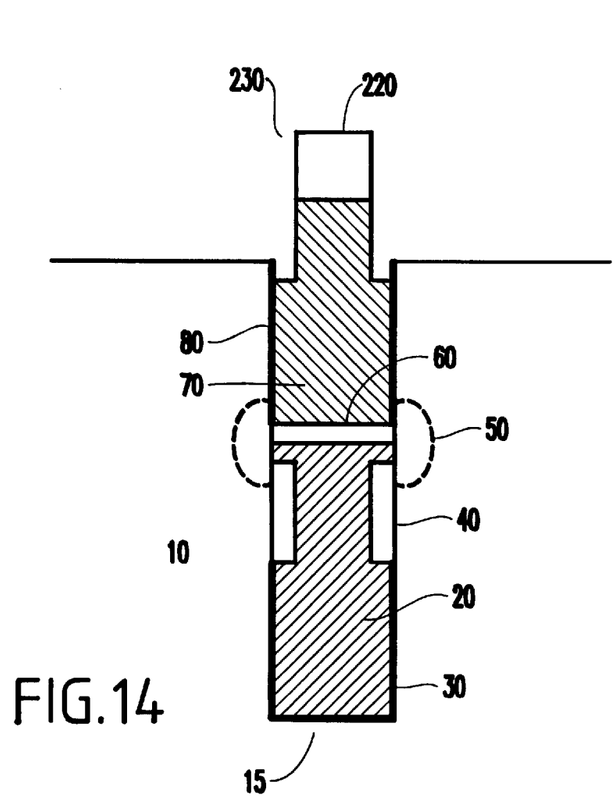
FIG. 14 is a schematic diagram of a partially completed storage structure according to the invention.

In FIG. 14, the pad nitride 100 is stripped away using similar processing as in FIG. 4, above. If an oxide were used as the plug material 220, then the plug would remain after the pad nitride strip. However, if a nitride plug 220 were used, the plug would also be stripped away with the pad nitride 100. If a photoresist 220 were used, it would need to be stripped away in a separate processing step after the isotropic polysilicon etch but before the pad nitride strip. The array implants 90 could be carried out after pad nitride strip, as discussed above.

Figure 15:
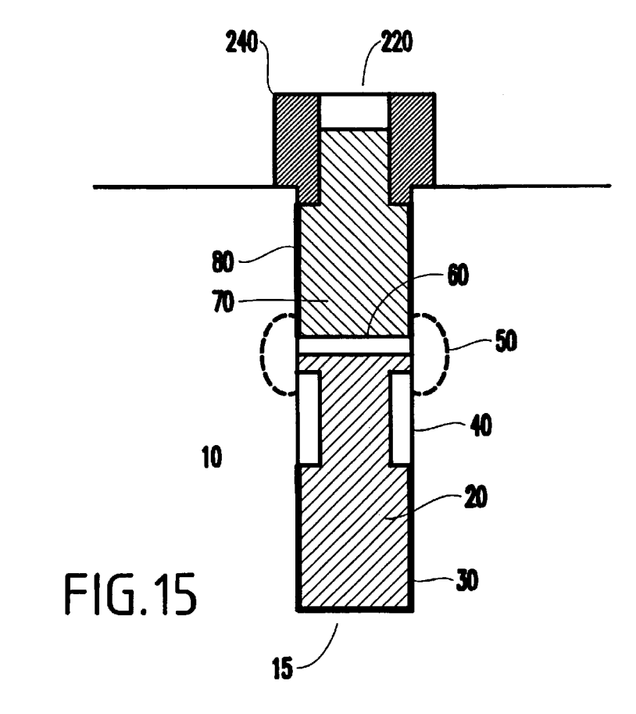
FIG. 15 is a schematic diagram of a partially completed storage structure according to the invention.
Figure 16:
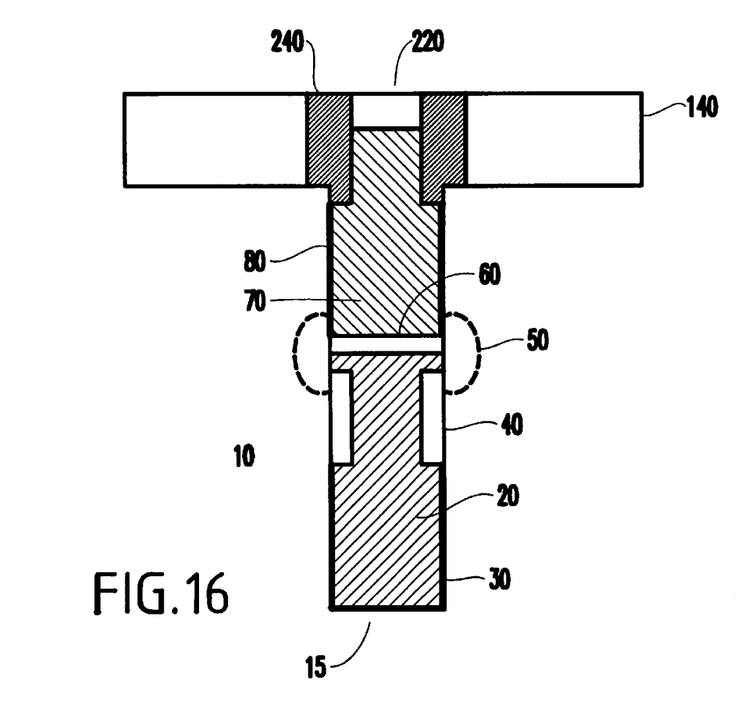
FIG. 16 is a schematic diagram of a partially completed storage structure according to the invention.

In FIG. 15, spacers 240 are applied by a conformal deposition step followed by an isotropic etch step in a similar manner to the formation of spacers 130. As before, nitride is the preferred material for these spacers 240. In FIG. 16, the top oxide 140 is deposited and planarized back as discussed above. Finally, FIG. 17 shows the final structure after the GC lines 150 and the bitline contacts 180 have been formed, as also discussed above.

Figure 17:
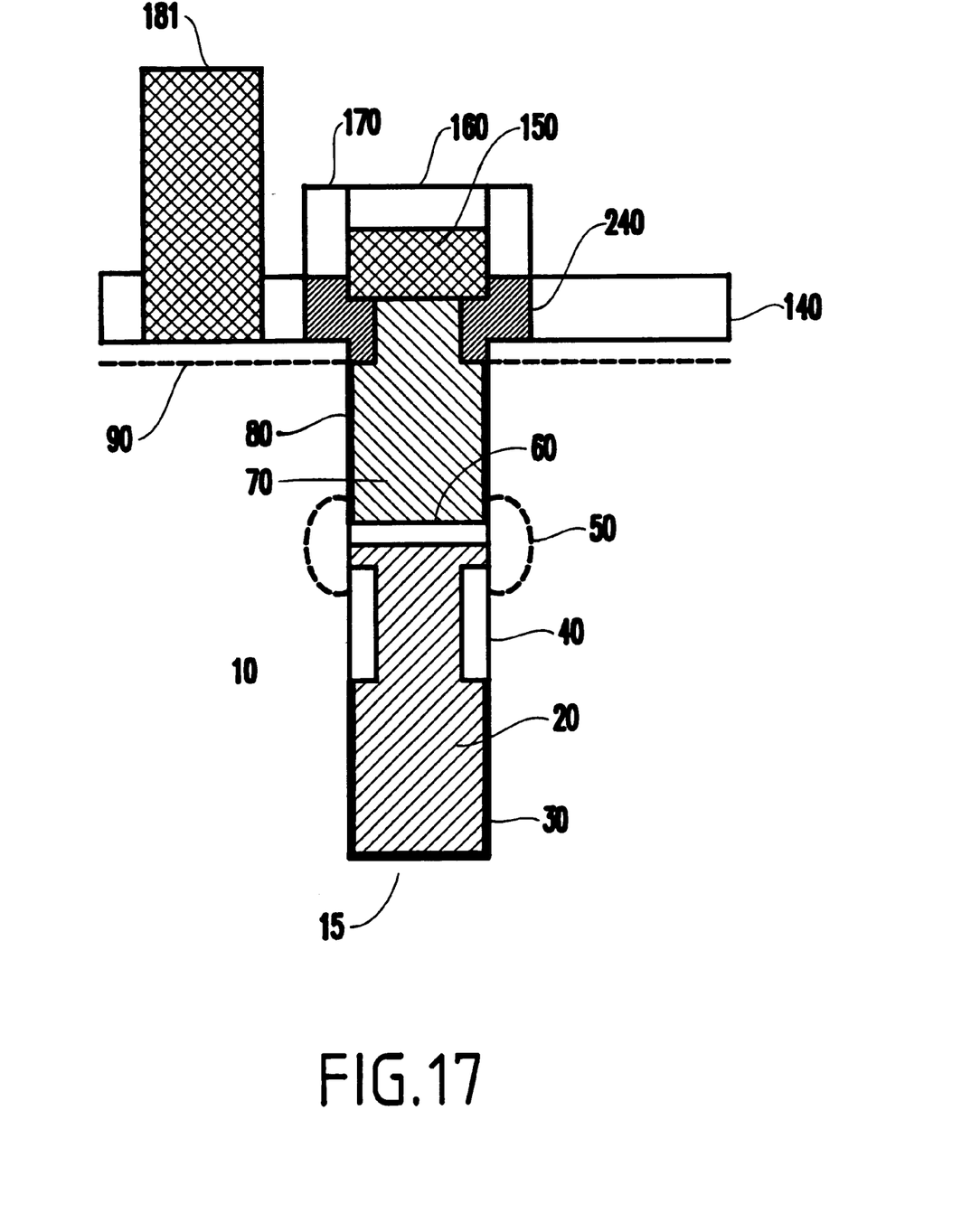
FIG. 17 is a schematic diagram of a storage structure according to the invention.

In both FIGS. 8 and 17, the height of the vertical GC and the nitride spacers is adjustable depending primarily on the starting pad nitride thickness. An advantage of the second sequence is that there is independent control over the width and the depth of the vertical gate polysilicon removal. The disadvantage is that the processing is more complicated.

By reducing the top diameter of the vertical GC and providing the spacer protection, this invention allows the deep trenches themselves to be larger in diameter which would facilitate the deep trench formation and the processes for forming the various structures inside the deep trench.

While the invention has been described in terms of preferred embodiments, those skilled in the art will recognize. that the invention can be practiced with modification within the spirit and scope of the appended claims.

What is claimed is:

1. A memory cell comprising:

a trench capacitor formed in a substrate having an upper substrate surface;

a vertical transistor adjacent said capacitor, said vertical transistor including a gate conductor above said trench capacitor, wherein said gate conductor includes an upper portion having a width less than that of a lower portion of said gate conductor; and spacers adjacent said upper portion of said gate conductor, said spacers extending below said upper substrate surface.

2. The memory cell in claim 1, further comprising a bitline contact adjacent said gate conductor, wherein said spacers reduce short circuits between said bitline contact and said gate conductor.

3. The memory cell in claim 2, further comprising a gate contact above said gate conductor and an insulator separating said gate contact from said bitline contact.

4. the memory cell in claim 2, wherein said spacers share a border with said bitline contact.

5. The memory cell in claim 1, wherein said trench capacitor has trench boundaries and said upper portion of said gate conductor is positioned within said trench boundaries.

* * * * *